US010311182B2

(12) United States Patent
Letzelter et al.

(10) Patent No.: US 10,311,182 B2

(45) Date of Patent: Jun. 4, 2019

(54) TOPOLOGICAL CHANGE IN A CONSTRAINED ASYMMETRICAL SUBDIVISION MESH

(71) Applicant: Dassault Systemes, Velizy Villacoublay (FR)

(72) Inventors: Frederic Letzelter, Longjumeau (FR); Jean-Marc Chauvet, Meyreuil (FR); Christophe Dufau, Fuveau (FR)

(73) Assignee: Dassault Systemes, Velizy Villacoublay (FR)

( * ) Notice: Subject to any disclaimer, the term of this patent is extended or adjusted under 35 U.S.C. 154(b) by 283 days.

(21) Appl. No.: 15/238,227

(22) Filed: Aug. 16, 2016

(65) Prior Publication Data

US 2017/0177771 A1 Jun. 22, 2017

(30) Foreign Application Priority Data

Dec. 16, 2015 (EP) .................................... 15307029
Dec. 16, 2015 (EP) .................................... 15307030

(51) Int. Cl.
*G06F 17/50* (2006.01)

(52) U.S. Cl.
CPC ................................ *G06F 17/5018* (2013.01)

(58) Field of Classification Search
CPC .................................................. G06F 17/5018
(Continued)

(56) References Cited

U.S. PATENT DOCUMENTS 6,993,463 B1 * 1/2006 Ewsuk ............... G06F 17/5018 419/23
7,893,937 B2 2/2011 Rosel et al.
(Continued)

FOREIGN PATENT DOCUMENTS

EP 1 881 457 A1 1/2008
WO WO 2013/060085 A1 5/2013

OTHER PUBLICATIONS

E. Subrahmanian, S. Fenves, S. Rachuri, R. Sriram, "Product lifecycle management support: A challenge in supporting product design and manufacturing in a networked economy" NIST, Mar. 2005; 23 pages.*

(Continued)

*Primary Examiner* — Dwin M Craig

(74) *Attorney, Agent, or Firm* — Hamilton, Brook, Smith & Reynolds, P.C.

(57) ABSTRACT

Embodiments provide methods and systems for modifying a finite element mesh representation of a three-dimensional model. A method according to an embodiment defines a symmetric constraint of a finite element mesh where the finite element mesh represents a subject 3D model and the symmetric constraint comprises two asymmetric zones of the finite element mesh to be modified symmetrically. Next, corresponding finite elements between the two asymmetric zones are identified and a topological manipulation to at least one of the identified corresponding finite elements is performed. In response, the topological manipulation is performed symmetrically on the identified finite element corresponding to the at least one finite element. In such an embodiment, performing the manipulation symmetrically results in the two asymmetric zones being modified symmetrically and represents a symmetrical topological modification in the subject 3D model.

23 Claims, 21 Drawing Sheets

(58) Field of Classification Search
USPC .............................................................. 703/1
See application file for complete search history.

(56) References Cited

U.S. PATENT DOCUMENTS

| | | | |
|---|---|---|---|
| 2004/0236455 A1 | 11/2004 | Woltman et al. | |
| 2006/0017723 A1 | 1/2006 | Baran et al. | |
| 2008/0084414 A1 | 4/2008 | Rosel et al. | |
| 2009/0128556 A1 | 5/2009 | Fischer et al. | |
| 2010/0066760 A1 | 3/2010 | Mitra et al. | |
| 2012/0229445 A1* | 9/2012 | Jenkins .................. | G06T 15/60 345/418 |
| 2012/0259593 A1* | 10/2012 | El-Zein ............... | G06F 17/5018 703/1 |
| 2015/0055085 A1 | 2/2015 | Fonte et al. | |
| 2017/0177770 A1 | 6/2017 | Letzelter et al. | |

OTHER PUBLICATIONS

European Search Report, "Topological Change in a Constrained Asymmetrical Subdivision Mesh", EP 15307030.5, dated Jun. 20, 2016.
European Search Report, "Modification of a Constrained Asymmetrical Subdivision Mesh", EP 15307029.7, dated Jun. 30, 2016.

* cited by examiner

TOPOLOGICAL CHANGE IN A CONSTRAINED ASYMMETRICAL SUBDIVISION MESH

RELATED APPLICATION(S)

This application claims priority under 35 U.S.C. § 119 or 365 to European Application No. 15307029.7, filed Dec. 16, 2015 and European Application No. 15307030.5, filed Dec. 16, 2015. The entire teachings of the above application(s) are incorporated herein by reference.

BACKGROUND OF THE INVENTION

Embodiments of the invention generally relate to the field of computer programs and systems and specifically to the field of product design and simulation. A number of existing product and simulation systems are offered on the market for the design and simulation of parts or assemblies of parts. Such systems typically employ computer aided design (CAD) and computer aided engineering (CAE) programs. These systems allow a user to construct, manipulate, and simulate complex three-dimensional models of objects or assemblies of objects. These CAD and CAE systems, thus, provide a representation of modeled objects using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometries, and representations may be stored in a single CAD file or multiple CAD files. CAD systems include graphic tools for representing the modeled objects to designers; these tools are dedicated to the display of complex objects. For example, an assembly may contain thousands of parts.

The advent of CAD and CAE systems allows for a wide range of representation possibilities for objects. One such representation is a finite element analysis (FEA) model. The terms FEA model, finite element model (FEM), finite element mesh, and mesh are used interchangeably herein. A FEM typically represents a CAD model, and thus, may represent one or more parts or an entire assembly. A FEM is a system of points called nodes which are interconnected to make a grid, referred to as a mesh. Thus, a FEM can be represented by vertices, edges, and/or faces. The FEM (including the edges, vertices, and faces) may be programmed in such a way that the FEM has the properties of the underlying object or objects that it represents. Additional information can be stored for each entity, i.e., edges, faces, and vertices, of the FEM to refine the description. For example, a finite element model may be programmed according to principles known in the art to have the structural properties, e.g., mass, weight, and stiffness of the object that it represents. Further, a FEM can include information such as the attraction of various entities of the FEM and tags for identification. When a FEM or other such object representation as is known in the art is programmed in such a way, it may be used to perform simulations of the object that it represents. For example, a FEM may be used to represent the interior cavity of a vehicle, the acoustic fluid surrounding a structure, and any number of real-world objects. Moreover, CAD and CAE systems along with FEMs can be utilized to simulate engineering systems. For example, CAE systems can be employed to simulate noise and vibration of vehicles.

SUMMARY OF THE INVENTION

Embodiments of the present invention provide methods and systems for modifying finite element mesh representations of three-dimensional (3D) models.

An embodiment of the present invention begins by a user defining a symmetric constraint of a finite element mesh representing a subject 3D model where the symmetric constraint comprises two asymmetric zones of the finite element mesh to be modified symmetrically. Next, such an embodiment identifies corresponding finite elements between the two asymmetric zones and in response to a user interaction, performs a topological manipulation to at least one finite element of the two asymmetric zones. In turn, the topological manipulation is performed symmetrically on the identified finite element corresponding to the at least one element. According to an embodiment, performing the manipulation symmetrically results in the two asymmetric zones of the finite element mesh being topologically modified symmetrically and further, represents a symmetrical topological modification in the subject 3D model.

In an embodiment, identifying corresponding finite elements between the two asymmetric zones comprises identifying symmetric edges, vertices, and faces of the two asymmetric zones. An alternative embodiment further comprises determining a local symmetric plane defined by the barycenter of the two asymmetric zones of the finite element mesh and normal to a direction defined by the two asymmetric zones of the finite element mesh. Moreover, such an embodiment may further comprise updating the symmetric constraint and the identified corresponding finite elements to reflect the performed topological manipulations using the determined local symmetric plane. According to an embodiment, updating the symmetric constraint comprises reconstructing a respective edge contour associated with each of the two asymmetric zones and reconstructing a respective border face associated with each of the two asymmetric zones.

The topological manipulations performed by embodiments may be any such topological modifications known in the art. In one such embodiment, the topological manipulation comprises at least one of: a face extrusion, an edge cut, a face subdivision, a bevel, and a face removal.

In an alternative embodiment, defining the symmetric constraint comprises at least one of: identifying a first group of connected faces and a second group of connected faces, identifying a plane and a group of connected faces, identifying a group of faces, and identifying a plane. According to yet another embodiment, the symmetric constraint may only apply to a subpart of the finite element mesh. In another embodiment, elements of the two asymmetric zones of the finite element mesh are identified with respective unique tags.

In an embodiment of the present invention, defining the symmetric constraint comprises determining a separating shape between the two asymmetric zones. In such an embodiment, the separating shape may be a plane. Moreover, in yet another embodiment, the separating shape is used in identifying the corresponding finite elements between the two asymmetric zones.

An alternative embodiment of the present invention is directed to a computer system for modifying a finite element mesh representation of a 3D model. Such a system comprises a processor and memory with computer code instructions stored thereon where the processor and the memory with the computer code instructions are configured to cause the system to implement the various embodiments described herein. In one such embodiment, the processor and the memory with the computer code instructions cause the system to: in response to a first user interaction, define a symmetric constraint of a finite element mesh representing a subject 3D model, the symmetric constraint comprising two asymmetric zones of the finite element mesh to be modified symmetrically and identify corresponding finite elements between the two asymmetric zones. Further, in such a computer system embodiment, the processor and the memory with the computer code instructions further cause the system to: in response to a second user interaction, perform a topological manipulation to at least one finite element of the two asymmetric zones and perform the topological manipulation symmetrically on the identified finite element corresponding to the at least one element. According to an embodiment, performing the manipulation symmetrically results in the two asymmetric zones of the finite element mesh being topologically modified symmetrically and represents a symmetrical topological modification in the subject 3D model.

According to an embodiment of the computer system, in identifying corresponding finite elements between the two asymmetric zones, the processor and memory, with the computer code instructions, are further configured to cause the system to identify symmetric edges, vertices, and faces of the two asymmetric zones. Moreover, according to another embodiment, the processor and the memory, with the computer code instructions, are further configured to cause the system to determine a local symmetric plane defined by a barycenter of the two asymmetric zones of the finite element mesh and normal to a direction defined by the two asymmetric zones of the finite element mesh and update the symmetric constraint and the identified corresponding finite elements to reflect the performed topological manipulations using the determined local symmetric plane. In yet another embodiment, in updating the symmetric constraint, the processor and memory, with the computer code instructions, are further configured to cause the system to reconstruct a respective edge contour associated with each of the two asymmetric zones and reconstruct a respective border face associated with each of the two asymmetric zones.

According to an embodiment of the computer system, the topological manipulation comprises at least one of a face extrusion, an edge cut, a face subdivision, a bevel, and a face removal. In yet another embodiment, the symmetric constraint applies only to a subpart of the finite element mesh. Moreover, according to another embodiment, in defining the symmetric constraint, the processor and the memory, with the computer code instructions, are further configured to cause the system to identify at least one of: a first group of connected faces and a second group of connected faces, a plane and a group of connected faces, a group of faces, and a plane. In yet another embodiment, the two asymmetric zones of the finite element mesh are identified with respective unique tags.

In one such computer system embodiment, in defining the symmetric constraint, the processor and the memory, with the computer code instructions, are further configured to cause the system to determine a separating shape between the two zones. An embodiment utilizes the separating shape in identifying the corresponding finite elements between the two zones. Further, in yet another embodiment, the separating shape is a plane.

Another embodiment of the present invention is directed to a cloud computing implementation for modifying a finite element mesh representing a 3D model. Such an embodiment is directed to a computer program product executed by a server in communication across a network with one or more clients, the computer program product comprising a computer readable medium. The computer readable medium comprises program instructions which, when executed by a processor causes: in response to a first user interaction, defining a symmetric constraint of a finite element mesh representing a subject 3D model, the symmetric constraint comprising two asymmetric zones of the finite element mesh to be modified symmetrically and identifying corresponding finite elements between the two asymmetric zones. Further, in such an embodiment, the program instructions, when executed, further causes: in response to a second user interaction, performing a topological manipulation to at least one finite element of the two asymmetric zones and performing the topological manipulation symmetrically on the identified finite element corresponding to the at least one element. In such an embodiment, performing the manipulation symmetrically results in the two asymmetric zones of the finite element mesh being topologically modified symmetrically and represents a symmetrical topological modification in the subject 3D model.

This present application is related to the application filed at the EPO on the priority date of the present application and by the same Applicant, entitled "MODIFICATION OF A CONSTRAINED ASYMMETRICAL SUBDIVISION MESH" and with the same inventors, whose entire teachings are incorporated herein by reference. Amongst other examples, the manipulation to at least one of the identified corresponding finite elements of the two asymmetric zones of the present application may be a manipulation performed as described in the related application and further, both applications may utilize the same or similar methodologies for defining the symmetric constraint, identifying corresponding finite elements, and performing the manipulation symmetrically.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Embodiments of the present invention relate to subdivision surfaces that are fully defined by subdivision meshes representing a 3D model. More specifically, embodiments deal with the concept of "symmetric shapes' which may be a standard functionality in CAD software. Embodiments provide more efficient methods and systems for providing such functionality.

Figure 1:
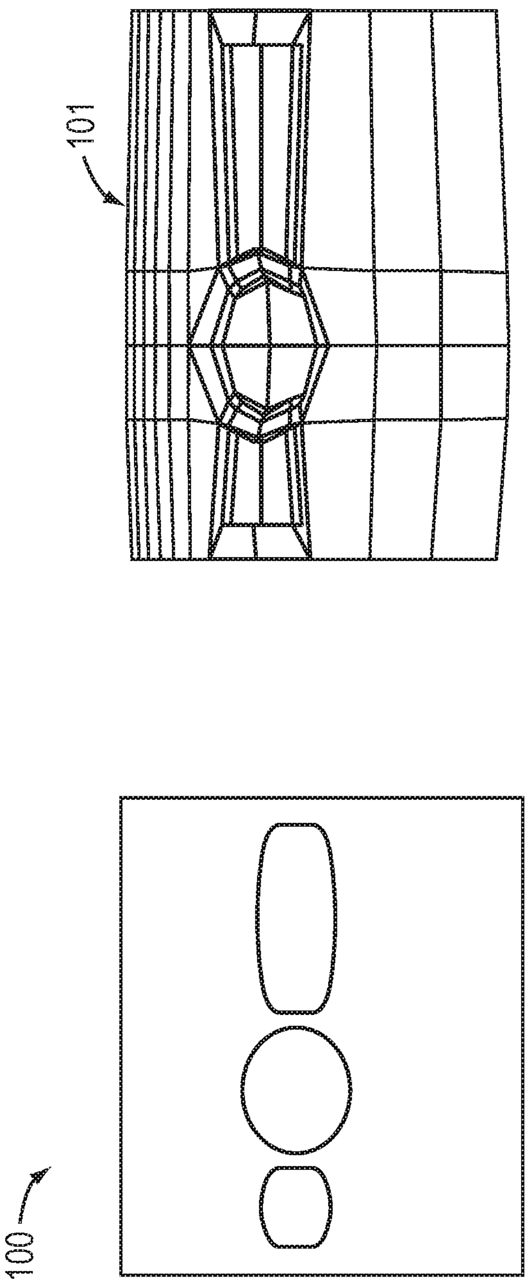
FIG. 1 depicts a surface and a finite element mesh that may be utilized in embodiments.

As noted herein, embodiments of the present invention relate to CAD and 3D models. FIG. 1 depicts one such surface 100 that is defined by the mesh 101. A designer, for example, can utilize embodiments of the present invention to increase efficiency while modifying the mesh 101. Thus, efficiently reflecting desired modifications to the surface 100.

Many manufactured objects are symmetrical or have some portion that is symmetrical, such as screens and televisions, phones, headphones, mugs, car seats, etc. Moreover, many real world objects themselves or portions thereof, may be asymmetrical, but nonetheless it may desirable to make changes to these portions symmetrically. Therefore, a constraint to maintain symmetrical properties of finite element meshes that represent real-world objects is a useful function in CAD software. Embodiments of the invention can be used to increase the efficiency in the design and modeling of almost any object, as most objects contain local or global symmetric or asymmetric portions that can be constrained utilizing principles of embodiments of the invention. For example, embodiments of the invention can be used in the design of a computer mouse with a trough for a user's thumb, a television with an asymmetric border for speaker or button location, a mobile phone, and a pair of scissors with two different size finger holes. In an example of the methods and systems described herein, the 3D model represents a headphone and the symmetric constraint relates to the two earphones and the manipulation is a design operation performed by a CAD designer to modify the shape and/or positioning of any one of the two earphones. In yet another embodiment, the 3D model represents the rear seat of a car and the entire seat is subject to the symmetric constraint. Thus, when a change is made, for example, to the left head rest of the seat, this change can be efficiently and automatically performed on the right head rest utilizing principles of embodiments of the present invention.

The main way to address the problem in the prior art is to provide a way to build or see a whole symmetric mesh from an ordinary subdivision mesh and a plane, i.e., create an entirely symmetric mesh from an original mesh. However, while such an existing solution allows a user to create a complete symmetric mesh, which means symmetric topologically and geometrically, this is not necessarily the most efficient solution for the design of the above mentioned manufactured objects from an ergonomics point of view. However, the existing solutions do not provide all functionality that may be desired. It is thus proposed, as an improvement, a method and system which allow the user to: define only a subpart of the mesh as symmetric; modify the right or left side of the symmetric zones; have some geometrical differences with a symmetric topology; move the mesh in a different place without breaking the symmetry constraint toward the selected plane; and/or refine or simplify the subdivision surface and keep the symmetric constraints as far as possible. Existing solutions do not provide the aforementioned functionalities amongst others.

As described above, the existing solutions have been designed for a whole subdivision mesh and a plane. Embodiments of the present invention utilize a constrained symmetric zone inside the subdivision mesh and maintain this constraint throughout modification of the mesh. This improves ergonomics.

Figure 2:
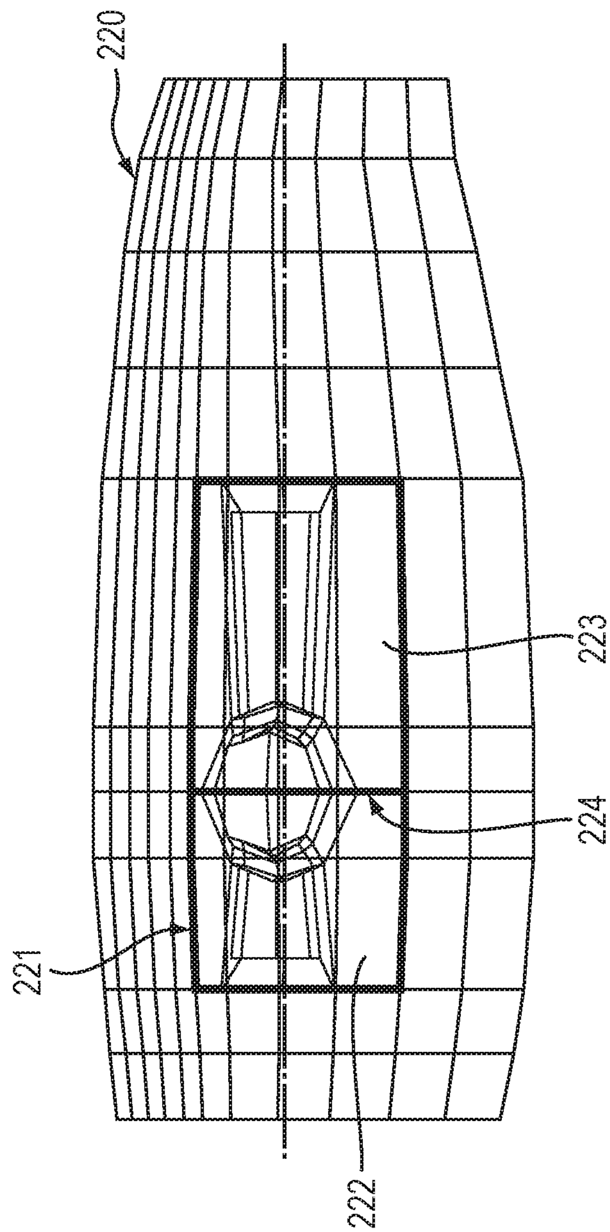
FIG. 2 illustrates a finite element mesh with a portion that is subject to a symmetric constraint according to principles of an embodiment of the present invention.
Figure 3:
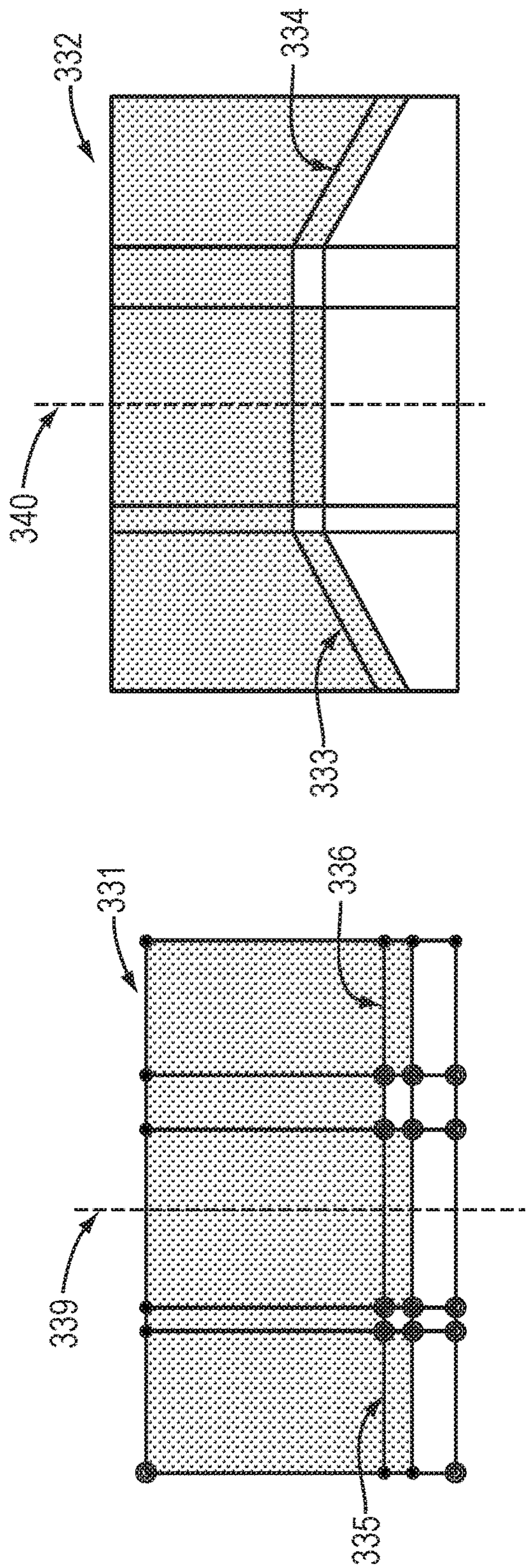
FIG. 3 depicts finite element meshes with geometric differences and symmetric topologies that may be utilized in one or more embodiments.

Embodiments of the present invention provide numerous functionalities that existing methodologies do not support. For example, embodiments of the present invention allow only a subpart of the mesh to be constrained as symmetric. FIG. 2 illustrates a mesh 220 where only the portion 221 is constrained as symmetric about the plane 224. Further, embodiments implement functionality where the right or left side of the symmetric zone can be modified. This functionality allows, for instance, the left side 222 and/or right ride 223 of the symmetric zone 221 to be modified. Moreover, as shown in FIG. 3 embodiments of the present invention support creating geometrical differences with symmetric topologies. In FIG. 3 the finite element meshes 331 and 332 are topologically equivalent but geometrically different. Amongst other reasons, the mesh 332 includes the edges 333 and 334 which are at different angles than the corresponding edges 335 and 336. Thus, the meshes 331 and 332 themselves are topologically symmetric about the planes 339 and 340 but they are not geometrically symmetrical about those same planes.

Figure 4:
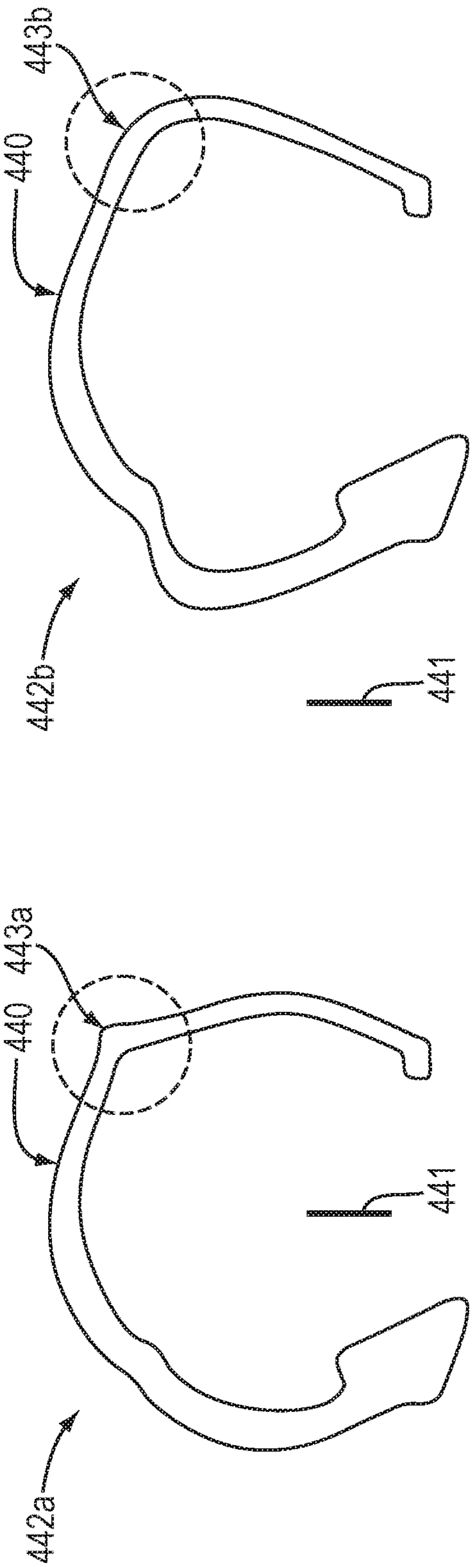
FIG. 4 illustrates example functionality provided by embodiments where a mesh can be moved and the symmetric constraint maintained.

Further embodiments provide the ability to move a mesh without breaking the symmetric constraint. FIG. 4 depicts a mesh 440 at a first position 442*a* that is constrained as being symmetric toward the plane 441. Subsequently, the mesh 440 is moved to position 442*b* and modified (distinction shown from 443*a* to 443*b*). By strictly defining a symmetrical constraint of the mesh 440 with the plane 441, the user is able to modify the shape with the constraint always on and move the mesh to a different place without breaking the symmetric constraint toward the selected plane. Embodiments of the invention may accomplish this by not considering the plane data after definition of the constraint. This solution allows symmetrical manipulation to be maintained for all elements of the mesh that will be moved. This also enables manipulations to asymmetric meshes. For example, in FIG. 4 the mesh 440 is asymmetric with regard to the plane 441 and thus, by not utilizing the plane data after the symmetric constraint has been defined, the mesh 440 can be moved in relation to the plane 441 as shown in the box 442*b* and the symmetric constraint can be maintained. According to an embodiment, this may be implemented by determining a new symmetric plane after the mesh 440 is moved.

Figure 5:
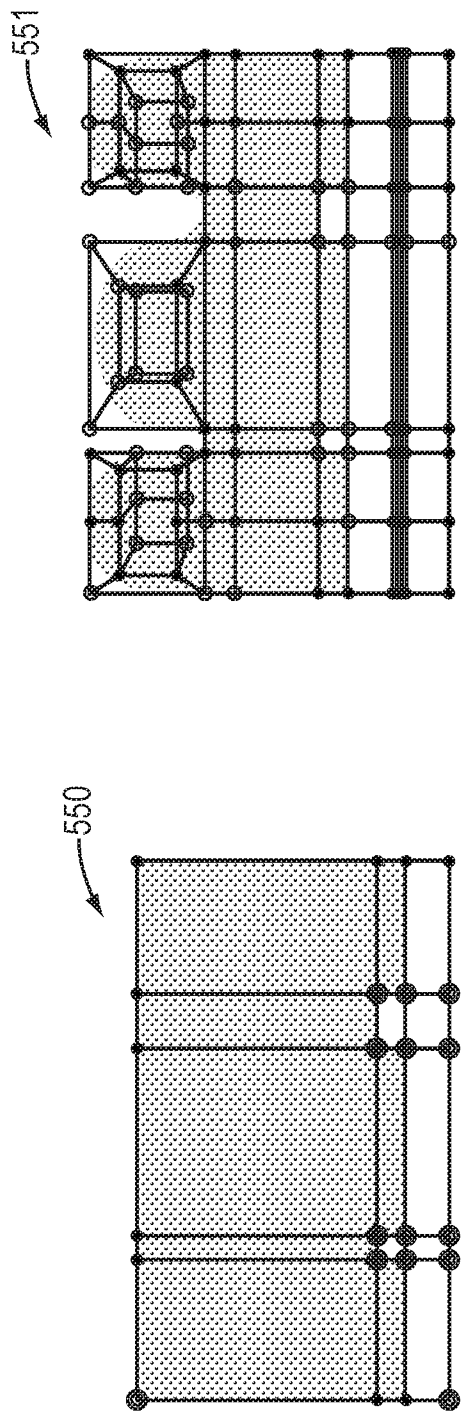
FIG. 5 depicts functionality provided by an example embodiment of the present invention.

Further embodiments provide functionality for the finite element mesh to be refined or simplified while keeping the symmetric constraints throughout as many modifications as possible. FIG. 5 depicts the mesh 550 and the modified mesh 551, where, through the variety of modifications needed to obtain the modified mesh 551, the symmetric constraint is maintained. While embodiments maintain the symmetric constraint through many modifications, in an alternative embodiment, there are limits to the modifications that can be performed while maintaining the symmetric constraint. For example, in an embodiment where particular conditions such as strong and destructive topological modifications are performed, it may be difficult to identify the contours of the symmetric zones. In an embodiment, functionality is provided to edit the symmetric constraint and/or re-define the symmetric constraint when the constraint cannot be maintained.

No known attempts have been made to define, store, and maintain such a "symmetric constraint" to be able to perform the aforementioned functionality. In an embodiment of the present invention, the symmetric zone is defined by being verified and created on the mesh itself. The constraint is "stored" through integration in the mesh surface and streamed and copied such that the mesh surface is no longer a simple base mesh. Further, the constraint is maintained by performing all operations, e.g., vertices translation, face extrusions, and face removal, on both sides of the mesh. No known CAD or other software has successfully dealt with this before.

Figure 6:
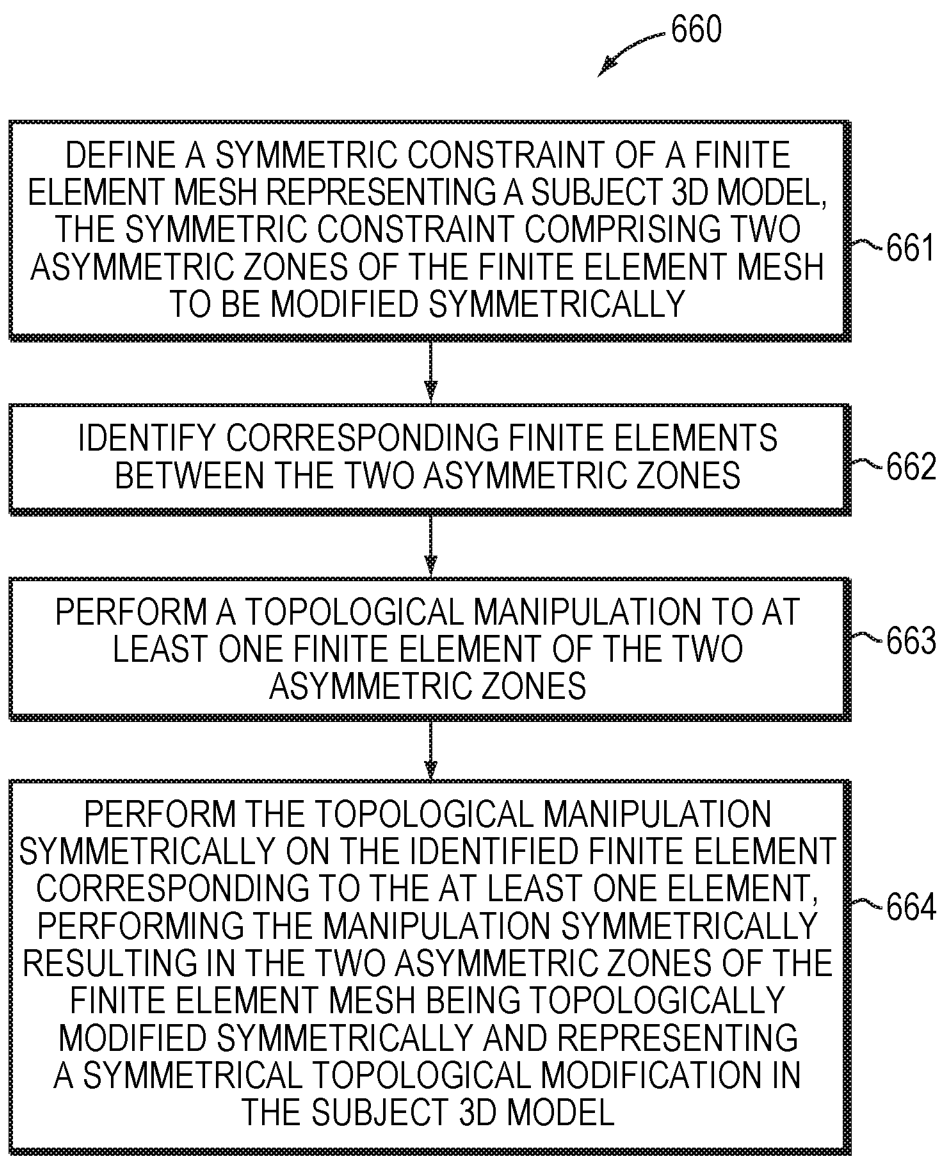
FIG. 6 is a flow diagram illustrating a computer-implemented method of modifying a finite element mesh according to the principles of an embodiment.

FIG. 6 is a flowchart of a computer-implemented method 660 for modifying a finite element mesh according to the principles of an embodiment of the present invention. The method 660 begins by defining a symmetric constraint of a finite element mesh where the symmetric constraint comprises two asymmetric zones to be modified symmetrically at step 661. The two asymmetric zones, according to an embodiment, each comprise a set of mesh elements, e.g., faces, vertices, and/or edges. According to an embodiment of the method 660, the finite element mesh represents a subject 3D model. The constraint may be defined using a variety of methodologies, such as identifying a first group of connected faces and a second group of connected faces, identifying a plane and a group of connected faces, identifying a group of faces, and identifying a plane. Further, embodiments of the method 660 may utilize any methodologies or combination of methodologies for defining a symmetric constraint described herein. Further details regarding methodologies for defining a symmetric constraint that may be utilized in the method 660 are described herein below in relation to FIGS. 7-10. For example, in an embodiment, a subject mesh is displayed on a monitor and a user selects the faces, edges, and/or vertices of the mesh that comprise the symmetric zones using a mouse, touchscreen, or any user/interface methodology known in the art. In another embodiment, the symmetric constraint may be identified by selecting the plane of symmetry. Further, the symmetric constraint may be defined to comprise any portion of the mesh, e.g. the entire mesh or some subpart of the finite element mesh.

As described above, the method 660 defines a symmetric constraint that comprises two asymmetric zones that are to be modified symmetrically. Embodiments of the method 660 may be utilized to modify a variety of finite element meshes where, for example, the mesh is asymmetrical, but it is desired that modifications be performed symmetrically. An example of such a mesh is depicted in FIG. 2, described hereinabove, where the mesh 220 includes the symmetric constraint 221 that comprises the two asymmetric zones 222 and 223. According to an embodiment, defining the symmetric constraint at step 661 includes determining a separating shape between the two asymmetric zones. In such an embodiment, the separating shape may be any such shape that is desired. Moreover, according to an embodiment the separating shape may be a default shape, such as a plane between the two zones. Further, in yet another embodiment, the separating shape is identified as a plane at the barycenter of the two asymmetric zones and normal to the direction between the two zones. According to embodiment, the plane and barycenter may be determined using any method known in the art. For example, the barycenter may be determined using the equation:

$$\Sigma^{n}_{i=1}\alpha_i\overrightarrow{GA_i}=\vec{0}.$$

Further, amongst other examples, the direction between the two zones can be identified using the barycenter of each closed contour of each zone. In such an example, a segment between those two barycenters can define the direction between the two zones. An example separating shape 224 is depicted in FIG. 2. Further, while the method 660 defines a symmetric constraint comprising two asymmetric zones, embodiments of the present invention are not so limited and in an alternative embodiment the symmetric constraint may comprise two symmetric zones.

After defining the symmetric constraint at step 661, the method 660 continues and identifies corresponding finite elements between the two asymmetric zones at step 662. According to an embodiment, identifying corresponding elements comprises identifying symmetric edges, vertices, and faces of the two zones. Examples of corresponding finite elements are described throughout, for example in relation to FIG. 12. For instance, the vertices (7,13) and (6,16) and faces (17,19) depicted in FIG. 12 may all be considered corresponding elements that may be identified during step 662 of the method 660. Further, according to an embodiment, identifying corresponding finite elements at step 662 may comprise identifying all such corresponding elements between the two asymmetric zones, or alternatively, any number of the corresponding elements. In an embodiment, the corresponding elements are automatically identified at step 662 using a neighborhood propagation method, such as the methodology described herein below in relation to FIG. 11. Further still, in yet another embodiment, corresponding finite elements may only be identified in response to a manipulation, i.e., after, for example, a face is extruded, the corresponding symmetric vertex may then be identified. In another embodiment of the method 660, a separating shape that is determined when defining the symmetric shape at step 661 may be used to identify corresponding elements between the two zones at step 662. For instance, the defined separating shape is used to identify the two zones and using principles described herein, the corresponding elements of these two zones can be identified.

Yet another embodiment of the method 660 utilizes respective unique tags for each element subject to the defined constraint. These unique tags can in turn be used in identifying corresponding finite elements between the two asymmetric zones at step 662. Further detail regarding the unique tags is described herein below in relation to FIG. 12.

After defining the symmetric constraint at step 661 and identifying corresponding finite elements at step 662, the method 660 continues by performing a topological manipulation to at least one of the identified corresponding finite elements of the two asymmetric zones at step 663. According to an embodiment, the manipulation may be performed in response to a user input or command. Embodiments of the present invention may provide functionality to implement any topological change known in the art. Example topological manipulations include a face extrusion, an edge cut, a face subdivision, a bevel, and a face removal.

In response to the manipulation at step 663, the topological manipulation is, in turn, performed symmetrically on the identified finite element corresponding to the at least one element at step 664. In other words, after a topological manipulation is performed on for example, a face, the manipulation is automatically performed symmetrically on the corresponding face in the other asymmetric zone. Examples of such functionality are depicted in FIGS. 13A-K and described herein below. Performing the manipulation symmetrically at step 664, results in the two asymmetric zones of the finite element mesh being topologically modified symmetrically. Further, such modifications at steps 663 and 664 may represent a symmetrical modification in the subject 3D model.

In an embodiment of the method 660, performing the manipulation symmetrically at step 664 includes determining a local symmetric plane defined by the barycenter of the at least one finite element and the identified finite element corresponding to the at least one element and normal to a direction defined by the at least one finite element and the identified finite element corresponding to the at least one element. Further, such an embodiment computes a symmetric transformation of the topological manipulation using the local symmetric plane and, in turn, performs the computed symmetric transformation on the identified finite element corresponding to the at least one finite element. In an example embodiment, the exact symmetric transformation is computed and performed, e.g., if a face is extruded 1 centimeter the corresponding face is also extruded 1 centimeter. In another embodiment, a proportional transformation is computed and performed. For instance, if a face that is 10 centimeters high is extruded 2 centimeters, the corresponding face is also extruded 20% of its height.

According to an embodiment of the method 660 the finite element mesh is a representation of a 3D model. As described herein, 3D models and thus, finite element models that represent the same object may represent any variety of real world objects, such as cars, phones, and sporting equipment, etc. Finite element models may be programmed according to principles known in the art to have the structural properties, e.g., the mass and stiffness of the object that it represents. Thus, embodiments of the method 660 may be utilized to improve efficiency in design of such real world objects where symmetric modifications are desired.

Embodiments of the present invention may be utilized so that a mesh is subject to any number of symmetrical constraints. Thus, symmetrical constraints can be accumulated as part of a mesh thus enhancing design efficiency for users by performing manipulations symmetrically for various portions of a finite element mesh. Multiple constraints can be defined for a mesh with the same or different groups of finite elements. Moreover, embodiments of the method 660 may be utilized to perform topological modifications to multiple elements of a finite element mesh simultaneously. For example, several faces can be extruded at a time and, in turn, each corresponding face in the other asymmetric zone can be extruded symmetrically using principles of the embodiments described herein. Further, example embodiments of the present invention may further include functionality to ignore defined constraints where applicable. For instance, where a user selects multiple elements that are included in both asymmetrical zones, design intent may be determined so as to ignore the symmetrical constraint when changes are being made simultaneously to elements in both asymmetric zones. This may be necessary where, for example, a user bisects an entire mesh. Further detail regarding such functionality is described herein below in relation to FIG. 13E.

Defining and storing the symmetric constraint according to principles described herein provides the ability to reconstruct the two portions of the mesh subject to the constraint in most cases of mesh modifications. Further, the methodologies described herein also ensure the reconstructions of the right and left edge contours after each modification (cut, extrude, subdivide, bevel, etc.).

Topological changes at steps 663 and 664 performed utilizing the method 660 may, for example, result in the subject finite element mesh having additional faces, edges, and vertices. Thus, embodiments of the method 660 provide functionality to update the defined symmetric constraint and identified corresponding finite elements to reflect the topological changes at steps 663 and 664. One such embodiment of the method 660 further comprises determining a local symmetric plane defined by a barycenter of the two asymmetric zones of the finite element mesh and normal to a direction defined by the two asymmetric zones of the finite element mesh. In turn, such an embodiment updates the symmetric constraint and identified corresponding finite elements to reflect the performed topological manipulations at steps 663 and 664 using the determined local symmetric plane. According to an embodiment, updating the symmetric constraint comprises reconstructing a respective edge contour associated with each of the two asymmetric zones and reconstructing a respective border face associated with each of the two asymmetric zones. Further detail regarding such methodologies is described herein in relation to FIGS. 15A-D.

Embodiments may utilize a variety of techniques to define the symmetric constraint. One such methodology defines the symmetric constraint with an automatic computation of the pairs of right and left elements among a set of faces. Other embodiments provide a way for users to define constrained elements in pairs. One example methodology that may be utilized in an embodiment is defining the symmetric constraint by two separate groups of connected faces. In such an embodiment, the plane about which the two groups are symmetric may be automatically detected.

Figure 7:
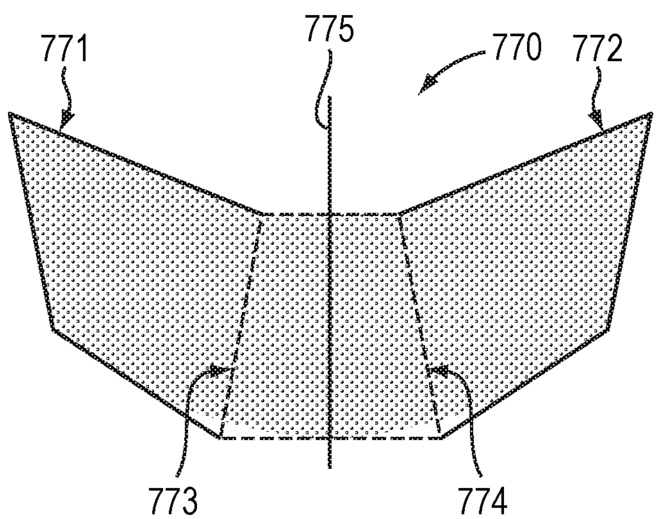
FIG. 7 illustrates a symmetric constraint defined according to an embodiment.

FIG. 7 depicts a symmetric constraint on the mesh 770 that is defined by the left group of faces 771 and the right group of faces 772. In such an example, the user may select the two groups of faces 771 and 772 or select one of the groups of faces, 771 or 772, to define the symmetric constraint. In this example, the center faces 773 and 774 are not subject to the constraint. Moreover, in such an example, the plane 775 about which the left group of faces 771 and right group of faces 772 are symmetric may be automatically identified, for example, by calculating the barycenter between the left group 771 and right group 772 and considering the direction between the two groups of faces 771 and 772. In such an example the calculated barycenter identifies the middle point between the two groups of faces and then, the symmetric plane is identified as the plane containing the barycenter and normal, i.e., perpendicular, to the directions between the two zones.

Figure 8:
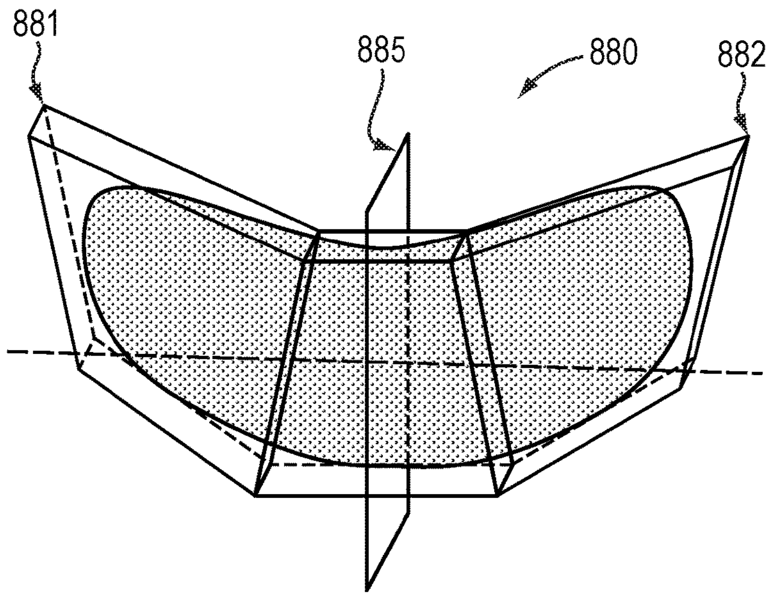
FIG. 8 depicts a finite element mesh comprising a symmetric constraint defined according to principles of an example embodiment.

FIG. 8 illustrates another example embodiment where the symmetric constraint is defined by two separate groups of faces. The symmetric constraint on the mesh 880 includes the separate groups of faces 881 and 882, each comprising five faces. The plane 885 about which the groups 881 and 882 are symmetric may be automatically determined similarly to the aforementioned example embodiment depicted in FIG. 7.

Figure 9:
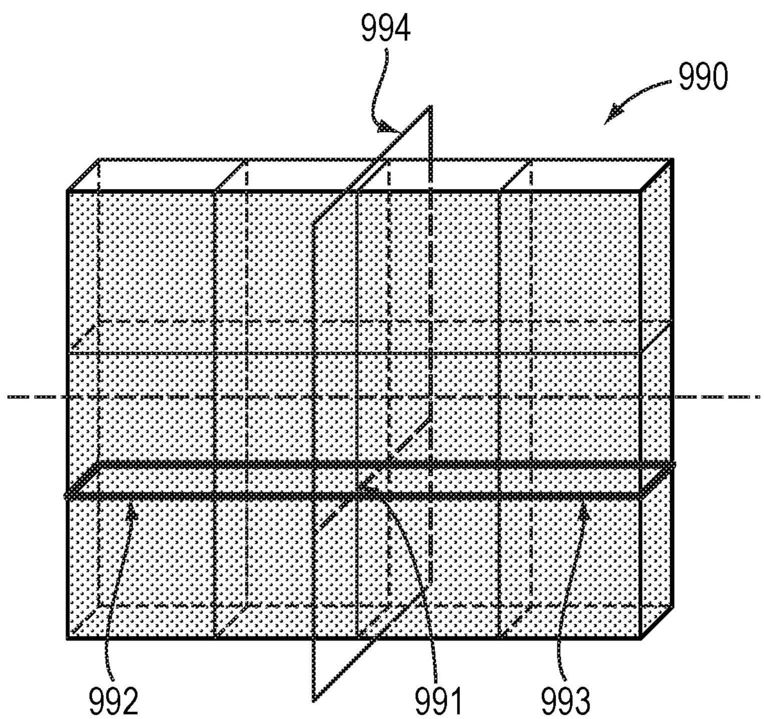
FIG. 9 is a finite element mesh with a symmetrically constrained region defined according to a methodology of an embodiment.

FIG. 9 illustrates a mesh 990 with a symmetric constraint defined according to principles of yet another embodiment. In the embodiment depicted in FIG. 9, the constraint is defined using one group of faces 991. In such an embodiment, one half 992 of the group of faces 991 is on one side of the plane 994 and the other half 993 of the group 991 is on the other side of the plane 994. In this example embodiment, where the constraint is defined by a single group of faces, the plane 994 can once again be automatically identified.

Figure 10:
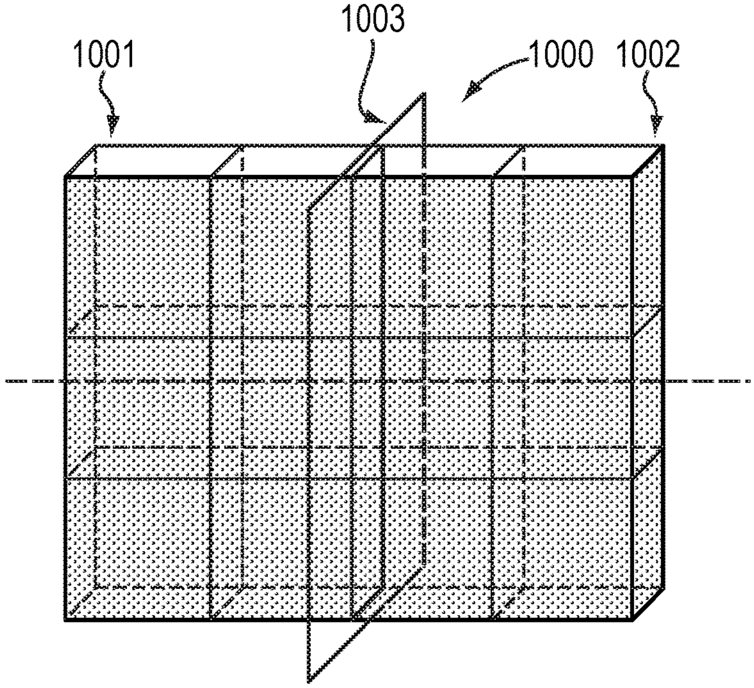
FIG. 10 portrays a finite element mesh symmetrically constrained according to an embodiment.

Further, while embodiments of the present invention provide functionality where only a portion of the finite element mesh is subject to the symmetrical constraint, embodiments of the invention are not limited to such methodologies. FIG. 10 depicts a finite element mesh 1000 where the entire mesh is subject to the constraint. As depicted in FIG. 10 the left portion 1001 and right portion 1002 are subject to the symmetric constraint about the plane 1003.

A symmetric constraint may also be defined by a plane and a group of connected faces. In such an embodiment, the middle junction to retrieve the separate symmetric zones can then be identified. Further still, embodiments may utilize a plane to identify the symmetric zone where the plane can be defined by elements of the mesh such as vertices, faces, and/or edges. While various different functionalities have been described for defining the symmetric zone, embodiments may use these functionalities in any combination. Further, constraints can be defined for a mesh using the same or different groups of selected faces.

Figure 11:
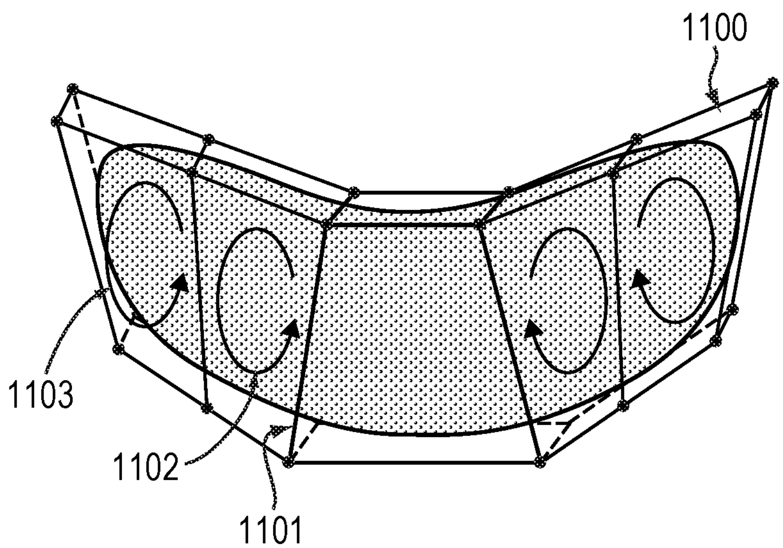
FIG. 11 illustrates a method of analyzing a finite element mesh that may be utilized in embodiments.

Embodiments may also comprise functionality to ensure that there is correspondence between vertices, edges, and/or faces that are subject to the symmetric constraint. One such example embodiment relies on a recursive algorithm based on the topology of the mesh to determine correspondence. In an embodiment, this is performed by analyzing the contours of each symmetric zone. An example of such is depicted in FIG. 11 where the mesh 1100 is analyzed to confirm correspondence between the vertices, edges, and faces subject to the constraint. Such an embodiment starts from the edge 1101 of the contour and from the mesh structure identifies the adjacent loop 1102. From the loop 1102 and the loop 1102 orientation, vertices and edges are retrieved in the proper order and paired together. Once the loop 1102 is processed, such a method then moves to the next loop 1103 and similarly identifies vertices and edges. This is carried out on both sides of the mesh 1100 and once all of the elements of both areas are processed the method stops and all elements are paired. In this way, because the edge contours and border faces of the constrained zones of the finite element mesh are associated, all elements of the two groups of connected faces, i.e., one side of the constraint and the other side of the constraint, are associated 2 by 2 in a neighborhood propagation. Moreover, when making such a determination the elements on the junction, e.g., plane of symmetry, can be their own symmetrical elements, but, in such an embodiment, selected faces are not left without a symmetrical face.

Embodiments of the invention also store the correspondence of each element (face, edge, or vertex) involved in each symmetric zone. This enables the ability to apply modifications across the symmetric plane in both directions, e.g., from right to left, and from left to right. Many constraints can be defined for a mesh with the same or different groups of selected faces. The constraint is stored in an efficient manner such that all scenarios can be performed and the invention can maintain the two symmetric zone definitions through any variety of modifications to the mesh. This means that the two groups of faces, edges, and/or vertices are kept through all modifications of the subdivision mesh. In some embodiments, the contour of the right faces, the contour of the left faces, and the border faces of each edge of the right and left contours may also be stored. Further detail regarding the aforementioned storage is described herein below in relation to FIG. 12.

Figure 12:
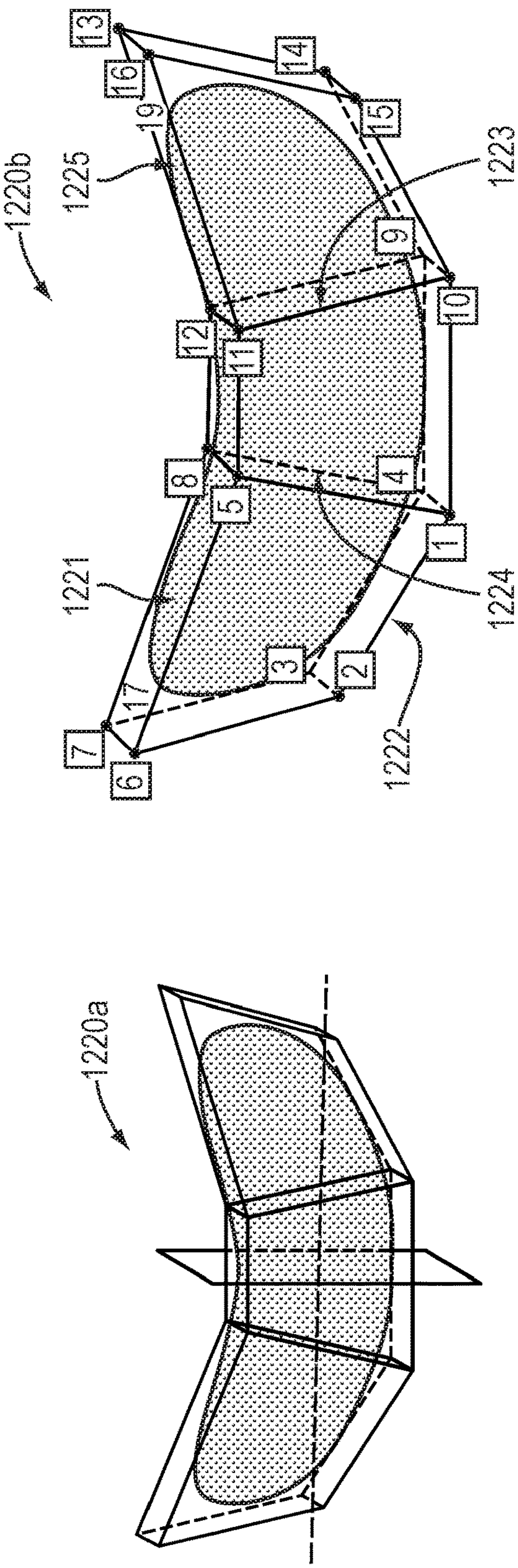
FIG. 12 depicts a finite element mesh with a unique tagging system that may be utilized in embodiments of the present invention.

Embodiments of the present invention may leverage a unique tagging system for identifying elements of a finite element mesh. FIG. 12 depicts one such example tagging system on the finite element mesh 1220*a* with tags depicted on the mesh 1220*b*. In embodiments, faces and vertices can be identified in the mesh using tags, such as numerals. FIG. 12 depicts the mesh 1220*b* with unique numerals identifying the vertices. Faces may be similarly labeled. For example, the face 1221 bounded by the vertices 5, 6, 7, and 8 may be identified with the label 17. In yet another embodiment, faces may be identified using the vertices that bound the face. Similarly, edges may be identified with unique identifiers or they may be identified by their two vertices tags. For instance, the edge 1222 may be identified as the edge (1,2).

In this example embodiment, the right contour 1223 and the left contour 1224 are stored in relation to vertices (11, 12, 9, 10) and (5, 8, 4, 1), respectively. Similarly, embodiments may do the same for the relative border faces of the contours 1223 and 1224. Embodiments of the invention may also store each pair of symmetric vertices and also each pair of symmetric faces. For example, all pairs of symmetric vertices (7, 13); (6,16); (3,14); (2,15); (8,12); (5,11); (4,9); and (1,10) may be stored. Symmetric faces, such as the faces (17, 19) and (1221, 1225), amongst others may be similarly stored. Embodiments may use unique identifiers for each edge or each edge may be identified by its respective vertex tags. For example, the left contour includes the edge (5,8); edge (8,4); edge (4,1); and edge (1,5) and the right contour includes the edge (11,12); edge (12,9); edge (9,10); and edge (10,11).

Figure 13A:
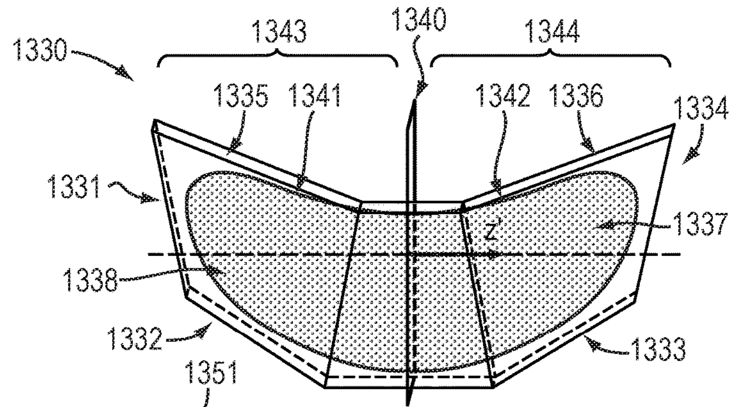
FIGS. 13A-K illustrate finite element meshes with topological changes that can be performed utilizing principles of embodiments of the present invention.

FIGS. 13A-K depict a variety of topological changes that may be implemented utilizing embodiments of the present invention. FIG. 13A depicts the original constrained mesh 1330. The mesh 1330 is constrained about the plane 1340. Thus, amongst others, the left zone 1343 includes the faces 1331, 1332, 1335 and 1338 and the right zone 1344 includes the faces 1333, 1337, 1334, and 1336. Further, the left zone

1343 includes the edge 1341 and the right zone includes the edge 1342. While the mesh 1330 and the constraint apply to additional finite elements of the mesh 1330, only those elements necessary to describe the various topological changes depicted in FIGS. 13B-K have been assigned reference numerals.

Figure 13B:
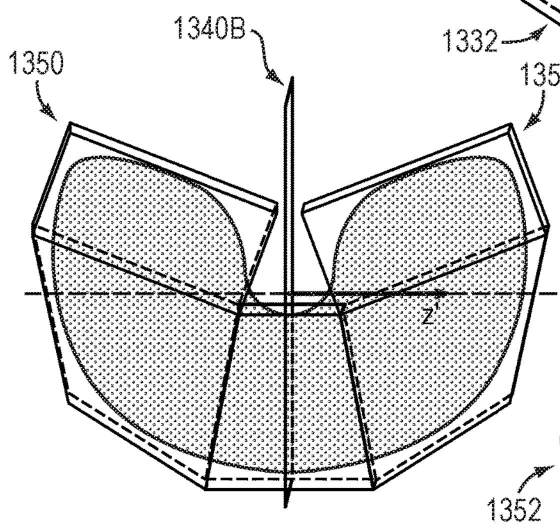
Figure 13C:
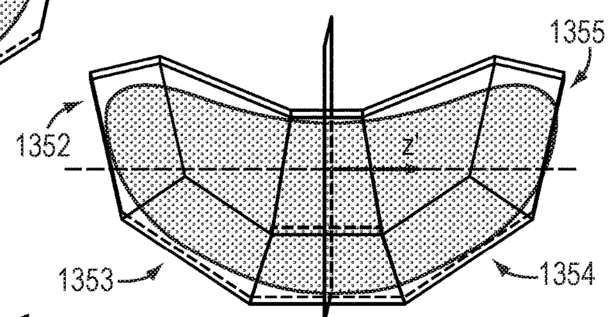

FIG. 13B depicts the extrusions 1350 and 1351 of the faces 1335 and 1336, respectively. According to an embodiment, a user for example, may extrude the face 1335 resulting in the extrusion 1350 and then, because the mesh 1330 is subject to a symmetric constraint as described herein, the extrusion 1351 is automatically performed on the corresponding face 1336. FIG. 13C similarly depicts the extrusions 1352, 1353, 1354, and 1355 of the faces 1331, 1332, 1333, and 1334, respectively. Again, by utilizing embodiments of the invention, a user can perform extrusions on one zone subject to the constraint, e.g. the faces 1333 and 1334 belonging to the right zone 1344 and the finite element mesh is automatically symmetrically topologically modified yielding the extrusions 1352 and 1353.

Figure 13D:
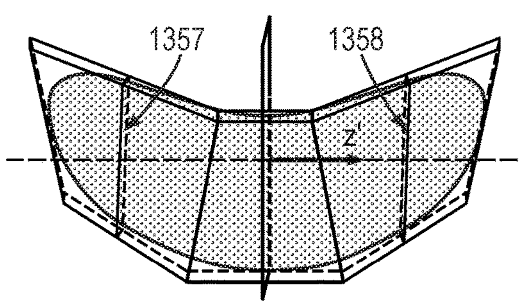
Figure 13E:
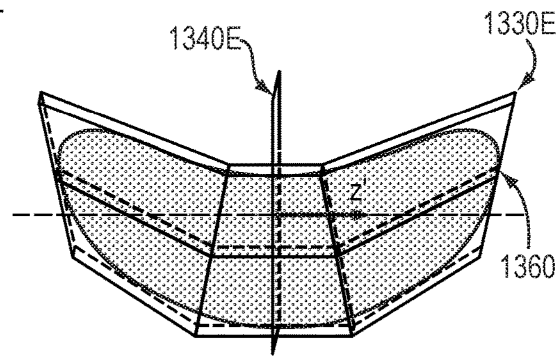

FIG. 13D depicts a vertical edge cut 1357 of the edge 1341. This in turn causes the topologically symmetrical edge cut 1358 to the edge 1342. As described herein, embodiments of the invention include functionality to ignore constraints where it conflicts with design intent. This for example, may occur when a user is simultaneously modifying elements that are in both zones subject to the constraint. One such example is the horizontal cut 1360 that horizontally cuts the entire mesh 1330E, as shown in FIG. 13E. When such an operation is performed the constraint is ignored. An improper result otherwise occurs, where after the cut 1360 is performed, an attempt is made to perform the cut 1360 symmetrically. However, if for example only the left zone was cut, i.e. the cut was performed on the elements to the left of the plane 1340E, then according to principles of embodiments of the present invention, the cut is then performed symmetrically, cutting the elements to the right of the plane 1340E.

Figure 13H:
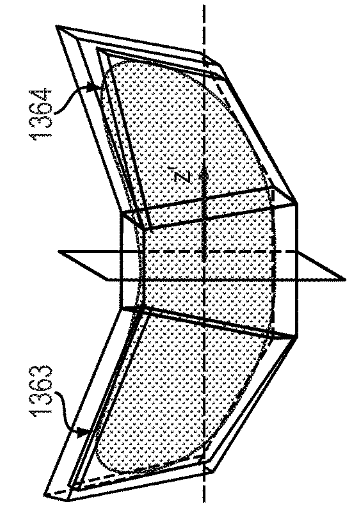
Figure 13G:
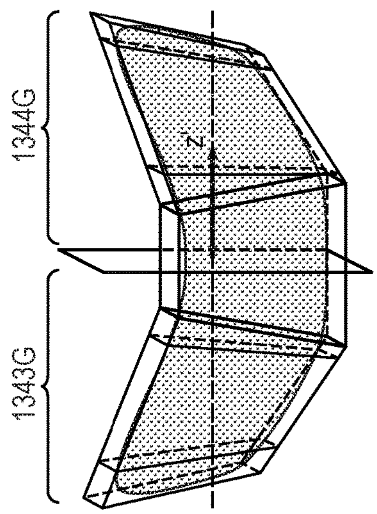
Figure 13F:
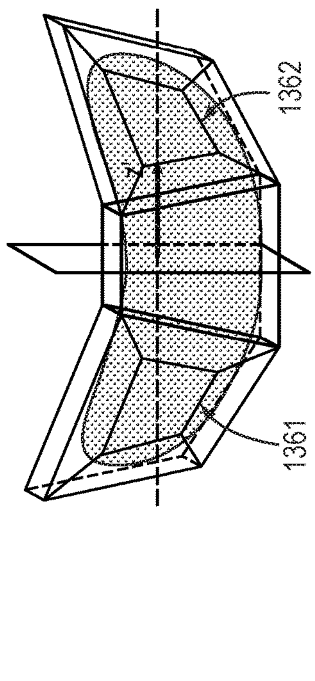

FIG. 13F depicts yet another topological manipulation that can be performed using embodiments of the present invention. In FIG. 13F the face 1338 of the original mesh 1330 is subdivided 1361 and in response, this subdivision is performed symmetrically on the face 1337 yielding the subdivided face 1362.

Figure 13K:
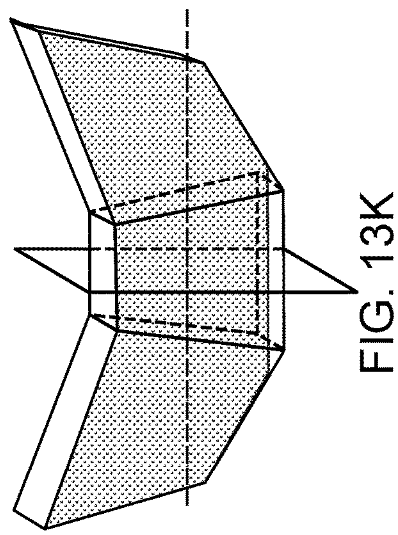
Figure 13J:
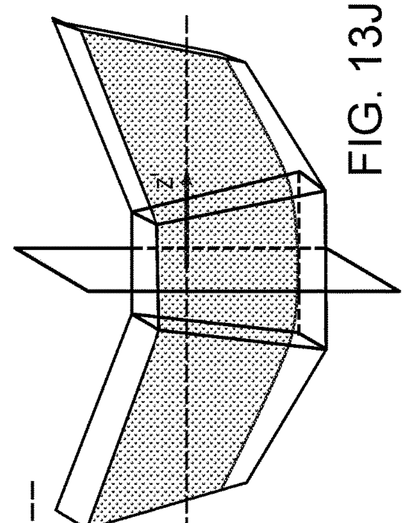
Figure 13I:
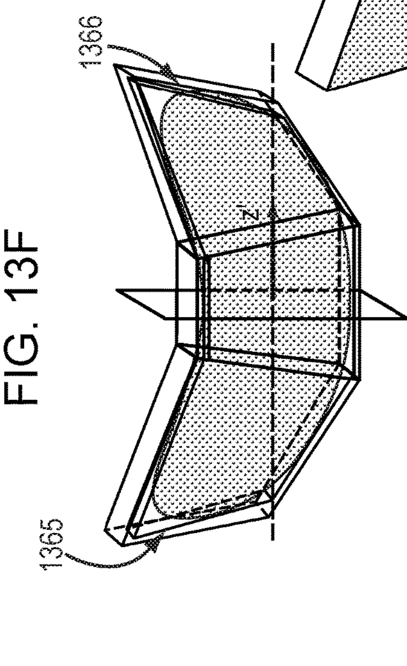

FIG. 13G depicts an example where the right side 1344 is beveled. A bevel operation replaces an edge (or a set of edges) with at least two edges (or sets of edges) in order to "pinch" the resulting surface. In FIG. 13G the right side 1344G is beveled and this results in the left side 1343 being symmetrically beveled as shown by the left side 1343G. FIGS. 13H and 13I depict the bevels 1363, 1364, and 1365, and 1366, respectively being performed on the faces 1338 and 1337. Further still, another example topological change is face removal. FIGS. 13J and 13K show the face 1334 of the original mesh 1330 removed. As with the other examples described herein, after removing the face 1334, the face 1331 is removed resulting in the mesh being topologically modified symmetrically.

Figure 14:
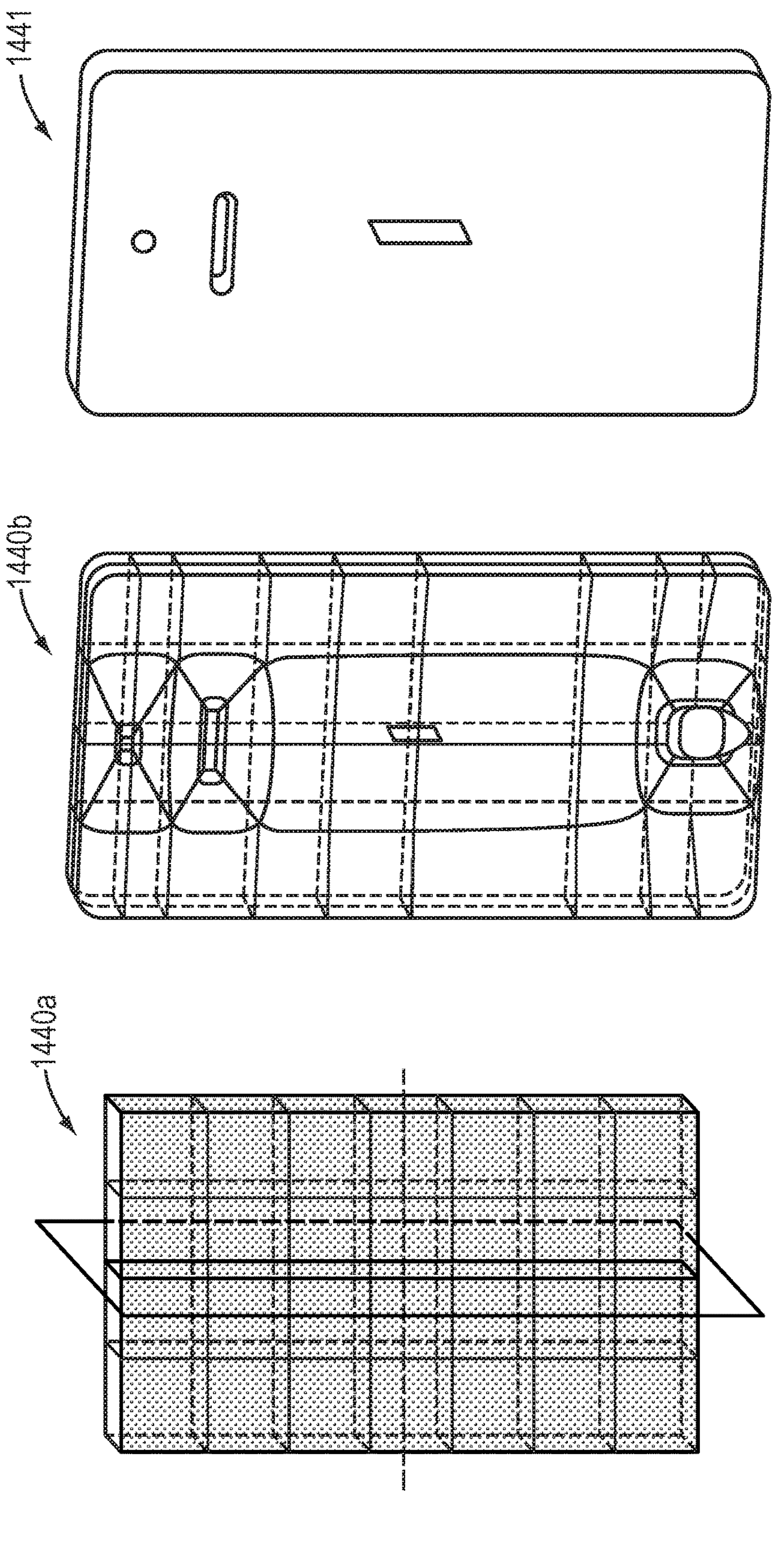
FIG. 14 depicts a finite element mesh at constraint creation and the finite element mesh after modifications according to an example embodiment.

Embodiments of the invention allow a user to quickly and easily create a 3D subdivision surface with zones that correspond to some part of the mesh or the complete mesh. This can greatly decrease the time it takes to carry out design changes to a finite element mesh. FIG. 14 illustrates an example of an original finite element mesh 1440*a* at constraint creation and the mesh after design changes have been carried out 1440*b*. In FIG. 14 the mesh 1440*a* is defined to have a symmetric constraint that applies to the entire mesh 1440*a*. In turn, when design changes are performed on the mesh they only need to be performed by the user on one side of the symmetric constraint. Thus, expediting the design process to more quickly yield the modified mesh 1440*b*. Further, this can expedite completing the 3D CAD model 1441.

Figure 15A:
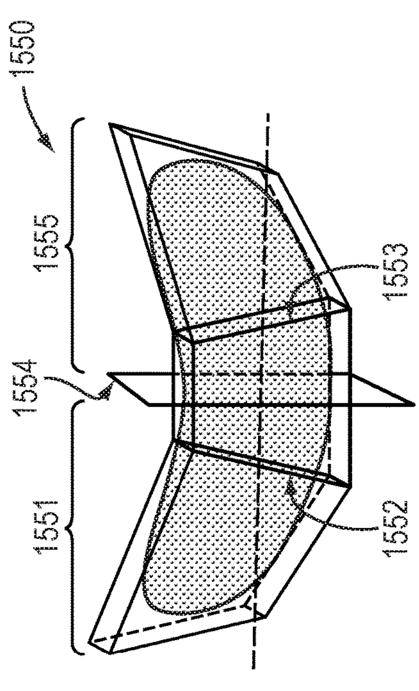
FIGS. 15A-D portray topological changes to a finite element mesh utilizing principles of an embodiment.

As described herein, a method of an embodiment of the invention may begin with defining the symmetric constraint. The symmetric constraint may be defined by selecting the faces of the zones the user wants to maintain as symmetrical. After defining the constraint, the user can begin modifications of the whole shape. FIG. 15A illustrates a mesh 1550 where the faces on the left side 1551 are selected. The default plane ZX 1554 is used to separate the left side 1551 of the constraint from the right side 1555 of the constraint. After selecting the faces and identifying the plane, which may include using the default plane 1554, the contours 1552 and 1553 are computed. In an embodiment, feedback may be provided to a user to indicate that the selected faces and counterpart faces can be identified so as to create a symmetric constraint. In an embodiment, this feedback may be provided through a pop-up message or through a visual indication such as highlighting the contours 1552 and 1553. Moreover, embodiments of the invention may provide further feedback through any means known in the art to a user that the constraint was successfully created. When the constraint is successfully created each face, edge, and vertex has its own corresponding face, edge, and vertex. Moreover, Applicant notes that while the terms "left" and "right" have been used throughout so as to describe finite elements on one side of a plane of symmetry from the other, embodiments are not so limited and embodiments may utilize symmetric constraints that are defined across any shape/direction.

Figure 15B:
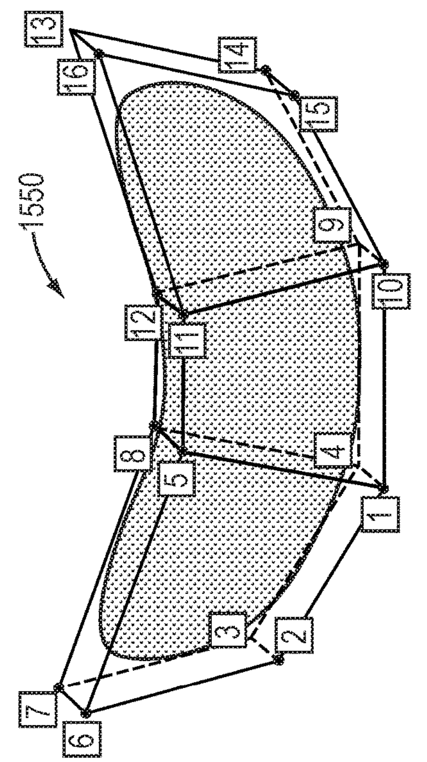
Figure 15C:
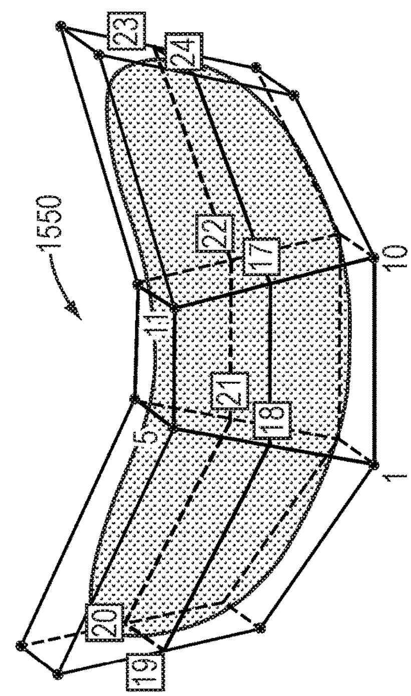

FIG. 15B depicts the mesh 1550 where a unique tagging system is used to identify the various finite elements of the mesh 1550. FIG. 15C illustrates the mesh 1550 after an edge has been cut. In this example, the edge (5,1) is cut, the same is done to the corresponding symmetric edge (11,10). In the contour, the edge (5,1) is replaced by two edges (5,18) and (18,1), and the edge (11,10) is replaced by the two edges (11,17) and (17,10). By updating the contour, embodiments of the invention can update the elements of the mesh that are subject to the symmetric constraint and the stored data on element correspondence in response to topological changes.

Figure 15D:
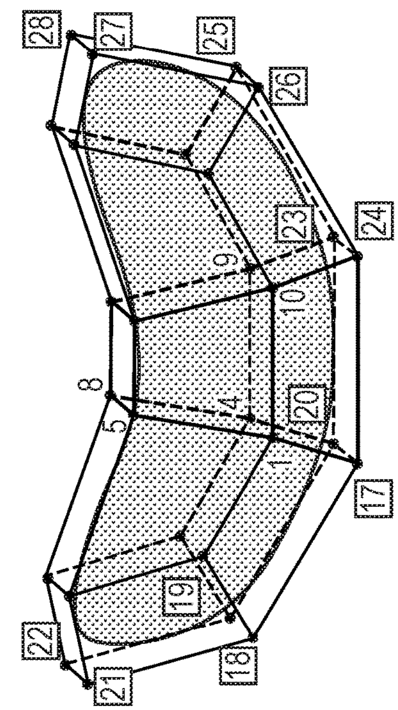

FIG. 15D depicts similar functionality as FIG. 15C, however illustrating the functionality when an extrusion has been performed. In FIG. 15C the edge (1,4) is replaced by the three edges (1,17); (17,20); and (20,4). Likewise, the same is done for the symmetric edge (10,9), which is replaced by the three edges (10,24); (24,23); and (23,9).

Embodiments of the present invention provide numerous advantages over existing methods that provide constraint functionality. One such advantage is the ability to absorb topological changes while keeping the symmetry constraint. In an embodiment, this is implemented by reconstructing the two edges contours and the associated border faces that are subject to the constraint. In such an embodiment, the edge contours are treated like a chain of vertices and the vertices always existing in the new mesh, i.e., mesh after the operation, are filtered. According to such an embodiment, when the contour is modified, a new contour composed of a chain of vertices is retrieved. Once this is done, the vertices which were in the contour before the operation are removed, i.e., filtered, from the computation to retrieve the new vertices which were inserted into this new contour as a result of the operation. From that point, the corresponding paired vertices on the other side are identified to update the other contour.

According to an embodiment, when an operation is performed on the mesh subject to a symmetric constraint, if two vertices of the old contour are not part of an edge of the new mesh, i.e., no longer neighbors, then the space between the two vertices is filled in, in order to close the contour. Embodiments of the invention may use the shortest path between two vertices to fill the contour. Such a methodology facilitates stabilizing the symmetric contours and also the whole "symmetric zones," because the zones can be defined by propagation from the contour to all the elements of the zone.

Embodiments of the present invention provide the functionality to maintain the constraint through all topological changes. Embodiments also integrate all the new vertices, faces and edges. For example, as described hereinabove in relation to FIGS. 15A-D, the original contours (and associated faces) are replaced by contours where each edge has been replaced by one or more edges, removed, or left unchanged. The same is true for border faces replaced by another face, removed, or left unchanged.

Figure 16:
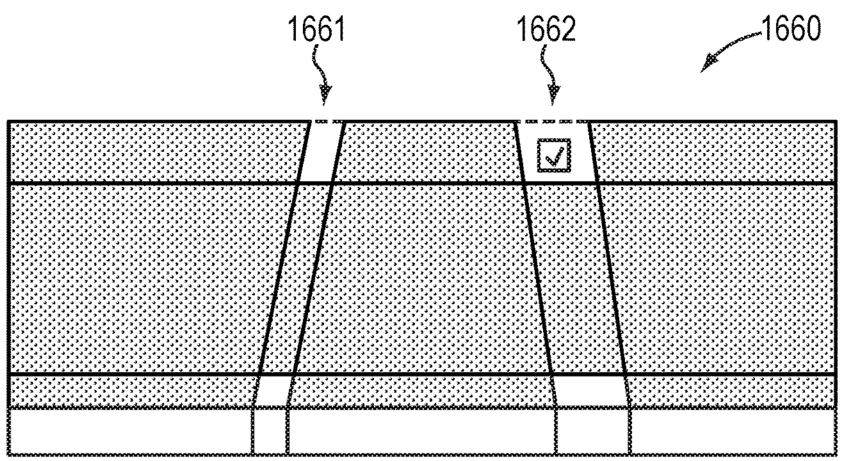
FIG. 16 depicts a topological change to a finite element mesh subject to a symmetric constraint defined according to the principles of an embodiment.

In an example embodiment of the present invention the creation of the constraint modifies the model of the stored mesh, but doesn't modify the shape of the mesh. In this way the constraint is made part of the original mesh. Thus, a mesh utilizing principles of an embodiment can be identified interactively. For example, where an element of an asymmetrical mesh (a face, an edge, or a vertex) can be modified by its symmetrical element, such as where a face is extruded; or if both constrained elements are modified together, the topological symmetry is maintained, but the constraint continues with an asymmetrical element. Such an example is depicted in FIG. 16 where the mesh 1660 has a constraint but also asymmetrical elements, such as the elements 1661 and 1662.

Figure 17:
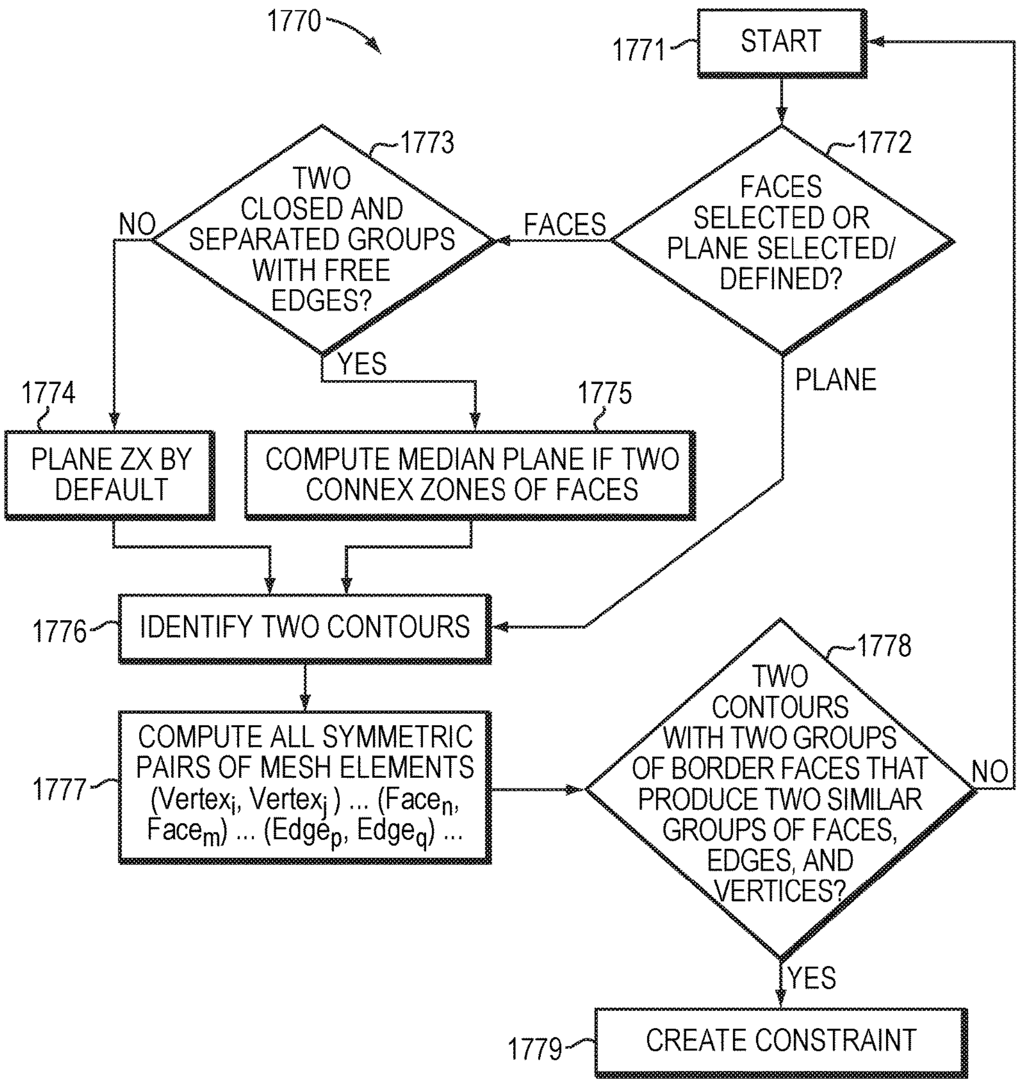
FIG. 17 is a flowchart of a computer automated method of defining a symmetric constraint according to an embodiment.

FIG. 17 is a flowchart of a computer automated method 1770 for modifying a finite element mesh according to an embodiment of the present invention. The method 1770 starts 1771 when a user starts defining a constraint by selecting faces, edges, and/or selecting/defining a plane of symmetry at step 1772. The user may select the faces/edges/vertices/plane according to any method known in the art. For instance, by selecting the faces on a display using a mouse. Alternatively, a user may select the faces on a touch screen or by entering a face label or position. Similar methods can be used for plane selection and definition. When a plane is defined or selected, the method 1770 proceeds to identify two contours at step 1776. When faces are selected, it is next determined if there are two closed and separated groups of faces with free edges at step 1773. If there are not two separated and closed groups with free edges the plane ZX is used by default at step 1774. If there are two separated and closed groups with free edges the median plane between the groups is computed between the two zones of faces at step 1775. After proceeding through the steps 1773-1775 or defining a plane at step 1772, the method 1770 continues by identifying the two contours of the symmetric constraint at step 1776. The contours are identified using the faces and plane that are subject to the constraint as described hereinabove. The two contours are the outline of the mesh elements subject to the constraint that are on opposite sides of the symmetric plane. According to an embodiment, the contours are composed of "border" edges of the selected zones. According to yet another embodiment, each contour is composed of chained vertices and defined by the closest path between the two vertices when new vertices are inserted during a topological modification as described herein. The two contours are the outline of the mesh elements subject to the constraint that are on opposite sides of the symmetric plane. Example contours 1552 and 1553 are illustrated in FIG. 15 and described hereinabove. After identifying the contours at step 1776 all symmetric pairs of vertices, faces, and edges are determined at step 1777. The symmetric pairs may be identified at step 1777 using any of the methodologies described herein, such as the neighborhood propagation methods described hereinabove in relation to FIG. 11. In turn, the identified contours 1776 and computed symmetric pairs at step 1777 are then tested to determine if a proper constraint can be defined at step 1778. According to an embodiment, the testing process browses the groups of elements, e.g., faces, edges, and vertices, and determines if each element has a pair. The testing of step 1778 determines whether there are two contours with two groups of border faces that produce two similar groups of faces, edges, and vertices. In other words, the testing determines whether each face, edge, and vertices has a corresponding face, edges, and vertices. When the conditions at step 1778 are met, the constraint is created at step 1779, when the conditions are not met, the method 1770 restarts 1771. In an alternative embodiment, a user can override the failed testing and identify the paired elements when the testing fails.

Figure 18:
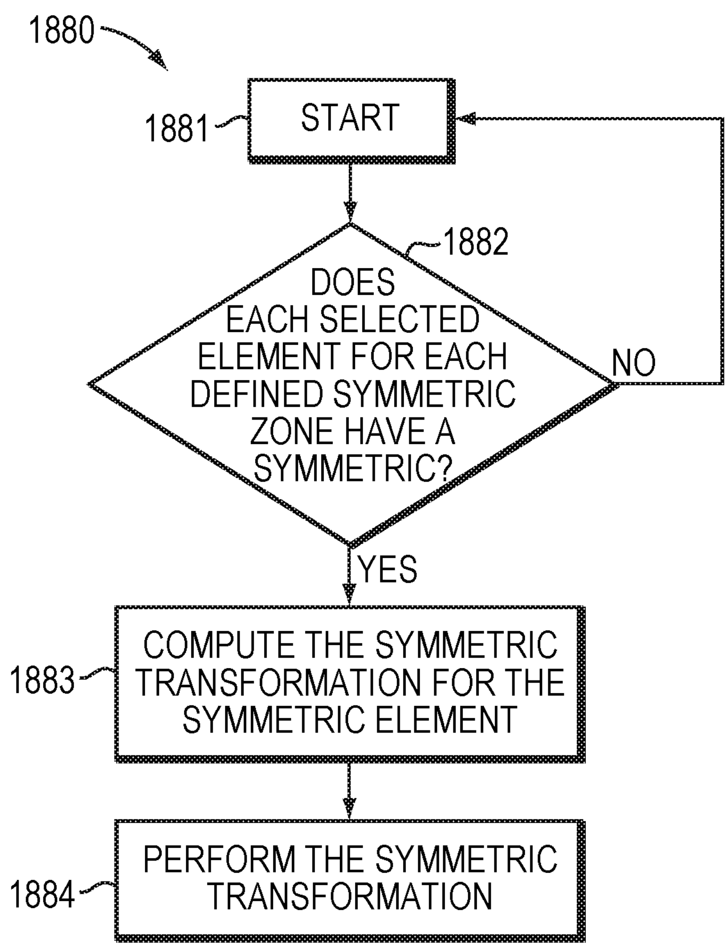
FIG. 18 is a flowchart of a computer-implemented method of modifying a mesh with a symmetric constraint according to the principles of an example embodiment.

FIG. 18 is a flowchart of a computer-implemented method 1880 of modifying a mesh with a symmetric constraint according to the principles of an example embodiment. The method 1880 starts 1881 and determines whether an element or multiple elements that have been modified, e.g. beveled, have a symmetric at step 1882. Because embodiments of the method 1880 allow a user to modify multiple elements at a time each element that is being modified in each symmetric zone is tested to determine if it has an appropriate symmetric. The method restarts 1881 is each element does not have a symmetric. However, when each selected element for each constraint has a symmetric, the symmetric transformation for each element is computed at step 1883 and, in turn, each symmetric transformation is performed at step 1884. The symmetric transformation may be computed using principles known in the art. Further, in an embodiment, for each modified vertex, edge, or face, the transformation T, e.g., move vector, transformation matrix, weight value, is retrieved. In turn, the local symmetry plane (middle point of paired points, symmetry plane computed from the barycenter and normal defined by the two paired points) is computed. Then, the corresponding symmetric transformation (matrix) is applied to this original transformation T to compute the symmetrical modification to be applied to the paired element (vertex or edge or face).

Figure 19:
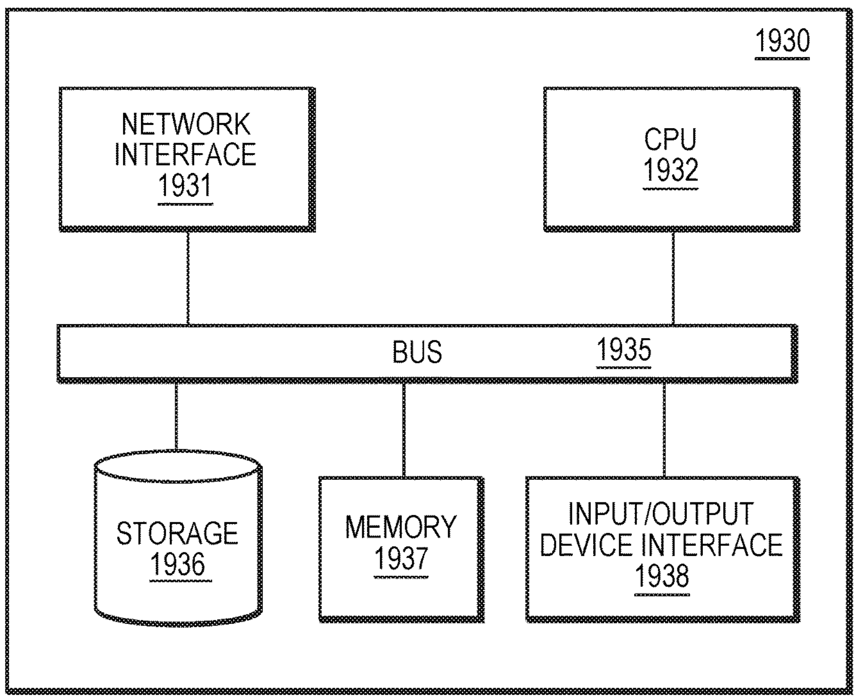
FIG. 19 is a simplified block diagram of a computer system for modifying a finite element mesh according to principles of an embodiment.

FIG. 19 is a simplified block diagram of a computer-based system 1930 that may be used to perform FEM modifications according to an embodiment of the present invention. The system 1930 comprises a bus 1935. The bus 1935 serves as an interconnect between the various components of the system 1930. Connected to the bus 1935 is an input/output device interface 1938 for connecting various input and output devices such as a keyboard, mouse, display, speakers, etc. to the system 1930. A central processing unit (CPU) 1932 is connected to the bus 1935 and provides for the execution of computer instructions. Memory 1937 provides volatile storage for data used for carrying out computer instructions. Storage 1936 provides non-volatile storage for software instructions, such as an operating system (not shown). The system 1930 also comprises a network interface 1931 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 1930, or a computer network environment such as the computer environment 2000, described herein below in relation to FIG. 20. The computer system 1930 may be transformed into the machines that execute the methods (e.g., 660, 1770, and/or 1880) described herein, for example, by loading software instructions into either memory 1937 or non-volatile storage 1936 for execution by the CPU 1932. One of ordinary skill in the art should further understand that the system 1930 and its various components may be configured to carry out any embodiments of the present invention described herein. Further, the system 1930 may implement the various embodiments described herein utilizing any combination of hardware, software, and firmware modules operatively coupled, internally, or externally, to the system 1930.

Figure 20:
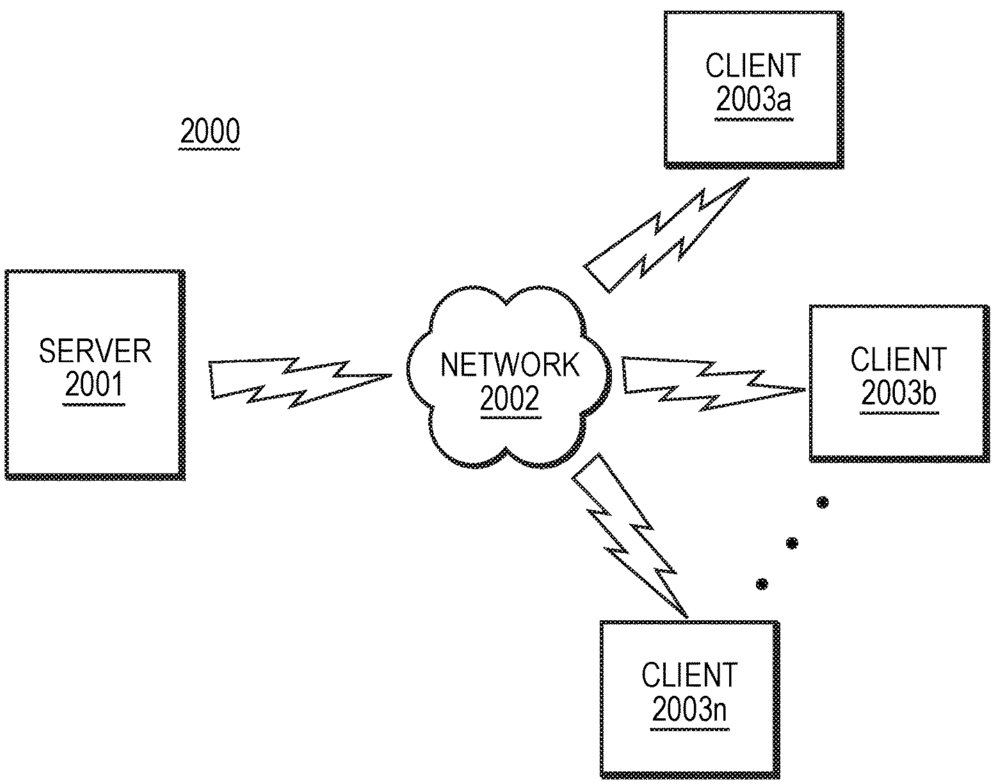
FIG. 20 is a simplified diagram of a computer network environment in which an embodiment of the present invention may be implemented.

FIG. 20 illustrates a computer network environment 2000 in which an embodiment of the present invention may be implemented. In the computer network environment 2000, the server 2001 is linked through the communications network 2002 to the clients 2003*a-n*. The environment 2000 may be used to allow the clients 2003*a-n*, alone or in combination with the server 2001, to execute any of the methods (e.g., 660, 1770, and/or 1880) described herein.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and networks diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of modifying a finite element mesh representing a computer aided design (CAD) 3D model representing a real-world object, the method comprising:

by a user, defining a symmetric constraint of a finite element mesh using a graphical user interface coupled to a processor, the finite element mesh representing a subject CAD 3D model including a shape of the subject CAD 3D model, the symmetric constraint comprising two asymmetric zones of the finite element mesh to be modified symmetrically;

automatically identifying, by the processor, existing corresponding finite elements between the two asymmetric zones;

performing by the user, user-interactively through the graphical user interface, a topological manipulation to at least one finite element of the two asymmetric zones; and performing automatically by the processor a symmetrical topological manipulation on the identified existing finite element corresponding to the at least one finite element, such that the symmetrical manipulation results in the two asymmetric zones of the finite element mesh being topologically modified symmetrically, thereby representing a symmetrical topological modification to the shape of the subject CAD 3D model.

2. The method of claim 1 wherein identifying corresponding finite elements between the two asymmetric zones comprises:

identifying symmetric edges, vertices, and faces of the two asymmetric zones.

3. The method of claim 1 further comprising:

determining a local symmetric plane defined by a barycenter of the two asymmetric zones of the finite element mesh and normal to a direction defined by the two asymmetric zones of the finite element mesh; and updating the symmetric constraint and the identified corresponding finite elements to reflect the performed topological manipulations using the determined local symmetric plane.

4. The method of claim 3 wherein updating the symmetric constraint comprises:

reconstructing a respective edge contour associated with each of the two asymmetric zones; and reconstructing a respective border face associated with each of the two asymmetric zones.

5. The method of claim 1 wherein the topological manipulation comprises at least one of:

a face extrusion;

an edge cut;

a face subdivision;

a bevel; and a face removal.

6. The method of claim 1 wherein the symmetric constraint applies only to a subpart of the finite element mesh.

7. The method of claim 1 wherein defining a symmetric constraint comprises at least one of:

identifying a first group of connected faces and a second group of connected faces;

identifying a plane and a group of connected faces;

identifying a group of faces; and identifying a plane.

8. The method of claim 1 wherein elements of the two asymmetric zones of the finite element mesh are identified with respective unique tags.

9. The method of claim 1 wherein defining the symmetric constraint comprises:

determining a separating shape between the two asymmetric zones.

10. The method of claim 9 wherein the separating shape is a plane.

11. The method of claim 9 wherein the separating shape is used in identifying the corresponding finite elements between the two asymmetric zones.

12. A computer system for modifying a finite element mesh representing a computer aided design (CAD) 3D model representing a real-world object, the computer system comprising:

a processor; and a memory with computer code instructions stored thereon, the processor and the memory, with the computer code instructions being configured to cause the system to:

implement, by a user, defining a symmetric constraint of a finite element mesh using a graphical user interface coupled to the processor, the finite element mesh representing a subject CAD 3D model including a shape of the subject CAD 3D model, the symmetric constraint comprising two asymmetric zones of the finite element mesh to be modified symmetrically;

automatically identify, by the processor, existing corresponding finite elements between the two asymmetric zones;

implement the user performing, user-interactively through the graphical user interface, a topological manipulation to at least one finite element of the two asymmetric zones; and perform automatically by the processor a symmetrical topological manipulation on the identified existing finite element corresponding to the at least one finite element, such that the symmetrical manipulation results in the two asymmetric zones of the finite element mesh being topologically modified symmetrically, thereby representing a symmetrical topological modification to the shape of the subject CAD 3D model.

13. The system of claim 12 wherein, in identifying corresponding finite elements between the two asymmetric zones, the processor and the memory, with the computer code instructions, are further configured to cause the system to:

identify symmetric edges, vertices, and faces of the two asymmetric zones.

14. The system of claim 12 wherein the processor and the memory, with the computer code instructions, are further configured to cause the system to:

determine a local symmetric plane defined by a barycenter of the two asymmetric zones of the finite element mesh and normal to a direction defined by the two asymmetric zones of the finite element mesh; and update the symmetric constraint and the identified corresponding finite elements to reflect the performed topological manipulations using the determined local symmetric plane.

15. The system of claim 14 wherein, in updating the symmetric constraint, the processor and the memory, with the computer code instructions, are further configured to cause the system to:

reconstruct a respective edge contour associated with each of the two asymmetric zones; and reconstruct a respective border face associated with each of the two asymmetric zones.

16. The system of claim 12 wherein the topological manipulation comprises at least one of:

a face extrusion;

an edge cut;

a face subdivision;

a bevel; and a face removal.

17. The system of claim 12 wherein the symmetric constraint applies only to a subpart of the finite element mesh.

18. The system of claim 12 wherein defining a symmetric constraint comprises at least one of:

identifying a first group of connected faces and a second group of connected faces;

identifying a plane and a group of connected faces;

identifying a group of faces; and identifying a plane.

19. The system of claim 12 wherein elements of the two asymmetric zones of the finite element mesh are identified with respective unique tags.

20. The system of claim 12 wherein defining the symmetric constraint comprises:

determining a separating shape between the two asymmetric zones.

21. The system of claim 20 wherein the separating shape is a plane.

22. The system of claim 20 wherein the separating shape is used in identifying the corresponding finite elements between the two asymmetric zones.

23. A computer program product for modifying a finite element mesh representing a computer aided design (CAD) 3D model representing a real-world object, the computer program product comprising computer-readable instructions stored on a non-transitory computer readable medium responsive to execution by a computing device that causes the computing device to perform operations comprising:

implementing by a user, defining a symmetric constraint of a finite element mesh using a graphical user interface coupled to a processor, the finite element mesh representing a subject CAD 3D model including a shape of the subject CAD 3D model, the symmetric constraint comprising two asymmetric zones of the finite element mesh to be modified symmetrically;

automatically identifying, by the processor, existing corresponding finite elements between the two asymmetric zones;

implementing the user performing, user-interactively through the graphical user interface, a topological manipulation to at least one finite element of the two asymmetric zones; and performing automatically by the processor a symmetrical topological manipulation on the identified existing finite element corresponding to the at least one finite element, such that the symmetrical manipulation results in the two asymmetric zones of the finite element mesh being topologically modified symmetrically, thereby representing a symmetrical topological modification to the shape of the subject CAD 3D model.

* * * * *